(12) United States Patent
Montoya

(10) Patent No.: US 6,271,676 B1
(45) Date of Patent: Aug. 7, 2001

(54) SPIRAL CHUCK

(75) Inventor: Thomas T. Montoya, Austin, TX (US)

(73) Assignee: TSK America, Inc., Farmington Hills, MI (US)

( * ) Notice: Subject to any disclaimer, the term of this patent is extended or adjusted under 35 U.S.C. 154(b) by 0 days.

(21) Appl. No.: 09/261,054

(22) Filed: Mar. 2, 1999

(51) Int. Cl.$^7$ .................................................. G01R 31/26
(52) U.S. Cl. .............................. 324/765; 451/289; 279/3
(58) Field of Search .................................. 324/750–772; 269/21; 279/3; 451/287, 288, 289, 290, 388, 41

(56) References Cited

U.S. PATENT DOCUMENTS

| | | | |
|---|---|---|---|
| 4,448,404 | * 5/1984 | Ogawa et al. | 269/21 |
| 4,590,422 | 5/1986 | Milligan . | |
| 4,864,227 | 9/1989 | Sato . | |
| 4,906,011 | * 3/1990 | Hiyamizu et al. | 279/3 |
| 5,033,538 | * 7/1991 | Wagner et al. | 165/80.1 |
| 5,369,358 | 11/1994 | Metzger et al. . | |
| 5,436,571 | 7/1995 | Karasawa | 324/765 |
| 5,469,073 | 11/1995 | Liebman et al. . | |
| 5,564,682 | * 10/1996 | Tsuji | 269/21 |
| 5,773,987 | 6/1998 | Montoya . | |
| 5,800,661 | * 9/1998 | Reis et al. | 156/285 |
| 5,834,106 | 11/1998 | Kamiaka et al. . | |
| 5,923,178 | 7/1999 | Higgins et al. | 324/754 |
| 6,051,067 | * 4/2000 | Mou et al. | 118/500 |

* cited by examiner

Primary Examiner—Ernest Karlsen
Assistant Examiner—Russell M. Kobert
(74) Attorney, Agent, or Firm—Dykema Gossett PLLC

(57) ABSTRACT

A chuck is provided for holding a semiconductor wafer using a suction force. The chuck includes a chuck plate and may further include a manifold plate, and a seal plate to form a laminated chuck configuration. The chuck plate is disposed about a first axis and includes a first contact region disposed on a first side. The chuck plate further includes a first groove within the first contact region extending generally spirally outwardly from a first location proximate to the first axis to a second location within the first contact region. The chuck plate further includes a first plurality of vacuum holes extending from the first groove into the first side of the chuck plate. A method is provided for a probing a test pad on a semiconductor die disposed on a semiconductor wafer and removing an oxide layer disposed on the test pad. A probe needle contacts the test pad and is overdriven less than or equal to 1 micron into the test pad. The chuck holding the semiconductor wafer is moved in four substantially linear movements defining a substantially quadrangular area wherein each side of the quadrangular area is less than or equal to 1 micron in length, to remove the oxide layer from the test pad.

23 Claims, 11 Drawing Sheets

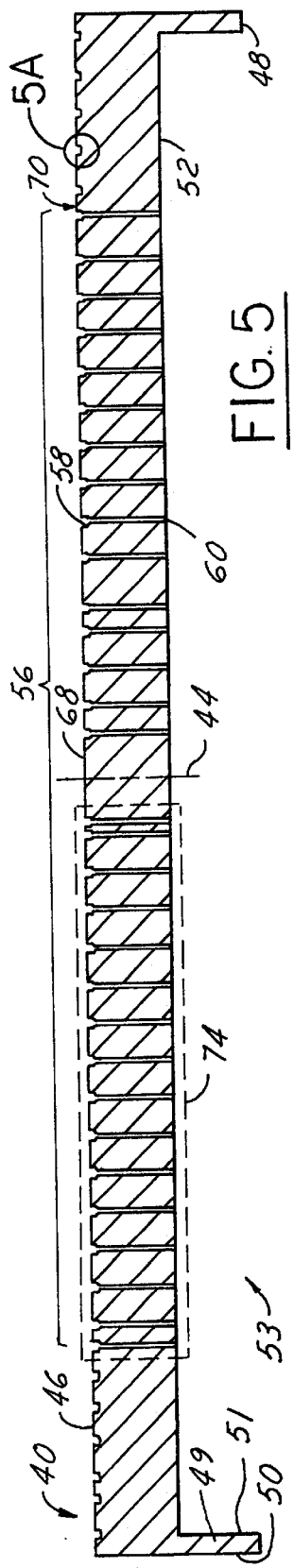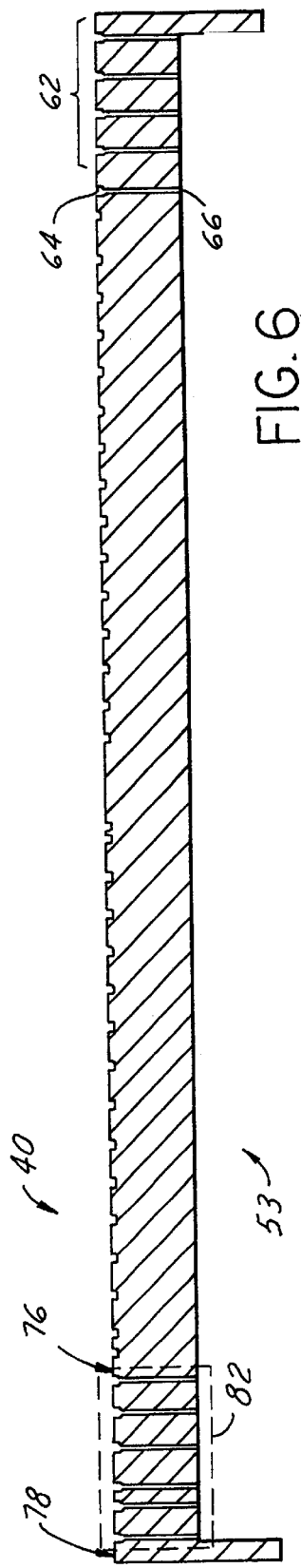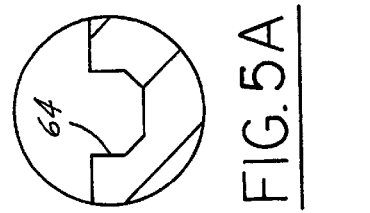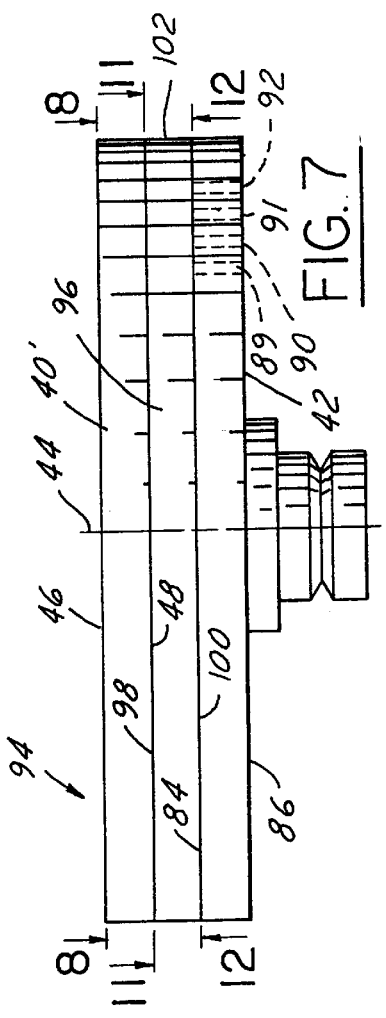

```
┌─────────────────────────────────────────────┐
│ PROVIDING A PROBER HAVING A PROBE NEEDLE AND A CHUCK │─ 136
└─────────────────────────────────────────────┘
                      │
┌─────────────────────────────────────────────┐
│ PLACING THE SEMICONDUCTOR WAFER ON THE CHUCK │─ 138
└─────────────────────────────────────────────┘
                      │
┌─────────────────────────────────────────────┐
│ MOVING THE CHUCK IN A VERTICAL DIRECTION TOWARD │
│ THE PROBE NEEDLE UNTIL PHYSICAL CONTACT IS MADE │─ 140
│ BETWEEN THE PROBE NEEDLE AND THE TEST PAD │
└─────────────────────────────────────────────┘
                      │
┌─────────────────────────────────────────────┐
│ OVERDRIVING THE CHUCK IN A VERTICAL DIRECTION │─ 142
│ A DISTANCE LESS THAN OR EQUAL TO 1 MICRON │
└─────────────────────────────────────────────┘
                      │
┌─────────────────────────────────────────────┐
│ MOVING THE PROBE NEEDLE IN FOUR SUBSTANTIALLY │
│ LINEAR MOVEMENTS DEFINING A SUBSTANTIALLY │
│ QUADRANGULAR AREA WHEREIN EACH SIDE OF │─ 144
│ THE QUADRANGULAR AREA IS LESS THAN OR │
│ EQUAL TO 1 MICRON IN LENGTH │
└─────────────────────────────────────────────┘
```

FIG. 21

SPIRAL CHUCK

BACKGROUND OF THE INVENTION

1. Field of the Invention

This invention relates to a device for holding a part and a method for making electrical contact with the part. In particular, this invention relates to a chuck for holding a semiconductor wafer using a suction force and a probing method for making electrical contact with a device test pad on the semiconductor wafer.

2. Disclosure of Related Art

Chucks have long been used to fixedly hold semiconductor wafers during testing. Each semiconductor wafer may contain several thousand integrated circuits ("die") on a wafer surface that must be tested. Probers having a chuck and a probe card are utilized to make electrical contact with the integrated circuits so that electrical test signals can be transmitted from testers to the integrated circuits. The probe cards contain conductive probe needles that make contact ("probe") with force on conductive test pads disposed on each integrated circuit.

Prior to testing the integrated circuits on a wafer, the prober "profiles" the wafer which means the prober determines the top surface topology of the wafer. Profiling of the wafer in a plurality of locations is needed because the wafer may not be flat. Generally, integrated circuits have a protective outer passivation layer that may be made from materials that induce a positive or negative surface tension. The positive or negative surface tension may cause a relatively thin wafer to be concave or convex in shape. To compensate for the irregularity in wafer flatness, the prober stores the wafer profile in memory and utilizes the profile during the subsequent probing of all of the integrated circuits on the wafer.

In a first conventional chuck design, an electrostatic force between a chuck and a wafer is used to fixedly hold the wafer against the chuck. The electrostatic force is created by inducing a positive charge on the metal chuck and inducing a negative charge on the wafer. A problem associated with the first conventional chuck is that the metal chuck acts as an antenna and induces electrical noise into the wafers during testing. The induced electrical noise may cause erroneous integrated circuit test failures. Additionally, the metal chuck deflects from the force exerted by the probe needles during probing. Deflection of the chuck may result in a poor electrical contact between the integrated circuit test pads and the probe needles, resulting in erroneous test failures. Additionally, the deflection of the chuck results in the probe needles contacting and fracturing the passivation layer surrounding the test pad which results in scrapped die.

In a second conventional chuck design, a chuck with a top surface containing a plurality of increasingly larger concentric vacuum grooves is utilized to hold a wafer against the chuck utilizing a suction force. Each concentric vacuum groove has one corresponding vacuum hole. A problem associated with the second conventional chuck is that a concave or convex shaped wafer may not be pulled flat during the "profiling" of the wafer resulting in erroneous integrated circuit test failures. The second conventional chuck has a small number of vacuum holes resulting in a relatively small amount of air flow through the vacuum grooves. The small amount of air flow through the vacuum grooves results in a relatively small suction force being applied to the wafer that may be insufficient to hold the wafer flat against the chuck. During wafer probing, when the probe needles initially contact an integrated circuit in an area of the wafer disposed off of the chuck, the probe needles may move the wafer a sufficient vertical distance so that the small vacuum force applied by the chuck causes the wafer to be sucked flat against the chuck. The shape of the wafer during subsequent testing no longer matches the wafer profile stored in the prober memory. Thereafter, the prober utilizing the profile may move the probe needles an insufficient vertical distance during probing to make electrical contact with the test pads on the integrated circuits resulting in erroneous integrated circuit test failures.

FIG. 1 illustrates a semiconductor die 10 including a substrate 12, an aluminum test pad 14, and an oxide layer 16. Die 10 is disposed on a chuck 18 and a probe needle 20 is contacting test pad 14 on die 10 to remove a portion of oxide layer 16 that forms on test pad 14. Oxide layer 16 also known as "flash oxide", automatically forms when aluminum test pad 14 is exposed to oxygen. Oxide layer 16 acts as an insulator and a portion of oxide layer 16 must be removed in order for probe needle 20 to have an electrical conduction path to test pad 14. In one known test pad scrubbing process, the oxide layer on a test pad is removed by moving a probe needle relative to the test pad a plurality of movements while contacting the test pad. Initially, the probe needle contacts the test pad at a first location. The probe needle is subsequently moved to a plurality of locations on the test pad to approximate a circular scrubbing motion. A problem with the above-described scrubbing process is that in order to move the probe needle in a circular motion relative to the test pad, a large plurality of X and Y axis movements are needed. Using the above-mentioned probing process may result in substantial probing time being required during the testing of wafers.

There is thus a need for a device and method that minimizes or eliminates one or more of the above-mentioned deficiencies.

SUMMARY OF THE INVENTION

The present invention provides a chuck for holding a semiconductor wafer using a suction force and a probing method for making electrical contact with a device test pad on the wafer.

One object of the present invention is to provide a chuck for fixedly holding a semiconductor wafer flat against a side of the chuck.

Another object of the present invention is to provide a method for probing a test pad on a semiconductor die that requires fewer and smaller movements of the probe needle or chuck to remove a portion of an oxide layer on the test pad as compared to conventional probing methods.

A chuck in accordance with a first embodiment of the present invention includes a chuck plate and a seal plate disposed about a first axis. The chuck plate has a first contact region disposed on a first side and a first groove within the first contact region extending from the first side into the chuck plate. The first groove extends generally spirally outwardly from a first location proximate to the first axis to a second location within the first contact region. The chuck plate has a second contact region disposed on the first side of the chuck plate and around the periphery of the first contact region. The chuck plate has a second groove within the second contact region extending from the first side into the chuck plate. The second groove extends generally spirally outwardly from a third location to a fourth location within the second contact region. The chuck plate includes a first chuck plate vacuum reservoir extending from a second side of the chuck plate into the chuck plate. The chuck plate includes a first plurality of vacuum holes extending from the first groove to the first chuck plate vacuum reservoir. The chuck plate includes a second plurality of vacuum holes extending from the second groove to the first chuck plate vacuum reservoir. The seal plate is disposed on a side of the chuck plate to seal against the chuck plate.

A chuck in accordance with a second embodiment of the present invention includes a chuck plate, a manifold plate, and a seal plate disposed about a first axis. The chuck plate in the second embodiment has a substantially similar first contact region, first groove, second contact region, and second groove as the chuck plate in the first embodiment. The chuck plate includes a first plurality of vacuum holes extending from the first groove through the chuck plate and a second plurality of vacuum holes extending from the second groove through the chuck plate. The manifold plate has a fifth side and a sixth side. The fifth side of the manifold plate is fixedly attached to the second side of the chuck plate. The manifold plate includes a first manifold plate vacuum reservoir extending from the fifth side into the manifold plate that is in fluid communication with the first groove. The manifold plate has a second manifold plate vacuum reservoir extending from the sixth side into the manifold plate that is in fluid communication with the second groove. The seal plate includes a third side and a fourth side wherein the third side is fixedly attached to the sixth side of the manifold plate to seal against the manifold plate.

A chuck in accordance with a third embodiment of the present invention includes a chuck plate disposed about a first axis. The chuck plate in the third embodiment has a substantially similar first contact region, first groove, second contact region, and second groove as the chuck plate in the first embodiment. The chuck plate includes a first chuck plate inlet hole disposed within the chuck plate and a first plurality of vacuum holes extending from the first groove to the first chuck plate inlet hole.

A chuck in accordance with a fourth embodiment of the present invention includes a chuck plate and a seal plate disposed about a first axis. The chuck plate in the fourth embodiment has a substantially similar first contact region, first groove, second contact region, and second groove as the chuck plate in the first embodiment. The chuck plate includes a first chuck plate vacuum reservoir extending from a second side of the chuck plate into the chuck plate that is in fluid communication with the first groove. The chuck plate includes a second chuck plate vacuum reservoir extending from the second side of the chuck plate into the chuck plate that is in fluid communication with the second groove. The chuck plate includes a first plurality of vacuum holes extending from the first groove to the first chuck plate vacuum reservoir. The chuck plate includes a second plurality of vacuum holes extending from the second groove to the second chuck plate vacuum reservoir. The seal plate is disposed on a side of the chuck plate to seal against the chuck plate.

A method for probing a test pad on a semiconductor die disposed on a semiconductor wafer in accordance with the present invention involves providing a prober having a probe needle and a chuck. The method further includes placing the semiconductor wafer on the chuck. The method further includes moving the chuck in a vertical direction toward the probe needle until physical contact is made between the probe needle and the test pad. The method further includes overdriving the chuck in a vertical direction a distance less than or equal to 1 micron. Finally, the method includes moving the chuck in four substantially linear movements while the probe needle is in physical contact with the test pad. The four substantially linear movements define a substantially quadrangular area wherein each side of the quadrangular area is less than or equal to 1 micron in length and occur while the probe needle is maintained stationary.

These and other features and objects of this invention will become apparent to one skilled in the art from the following detailed description and the accompanying drawings illustrating features of this invention by way of example.

BRIEF DESCRIPTION OF THE DRAWINGS

FIG. 5 is a sectional view of the chuck plate shown in FIG. 4 taken along lines 5—5.

FIG. 5A is an enlarged broken out portion of the chuck plate of FIG. 5, enclosed by circle 5A.

FIG. 6 is a sectional view of the chuck plate shown in FIG. 4 taken along lines 6—6.

FIG. 7 is a front view of a chuck in accordance with a second embodiment of the present invention.

FIG. 21 is a flowchart for a method of probing a test pad in accordance with the present invention.

DETAILED DESCRIPTION OF THE PREFERRED EMBODIMENTS

Figure 1:
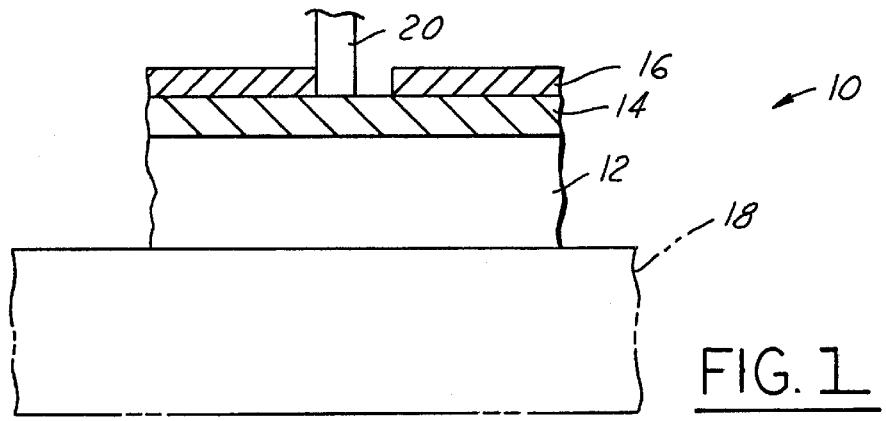
FIG. 1 is partial perspective view of a semiconductor die being contacted by a probe needle.
Figure 2:
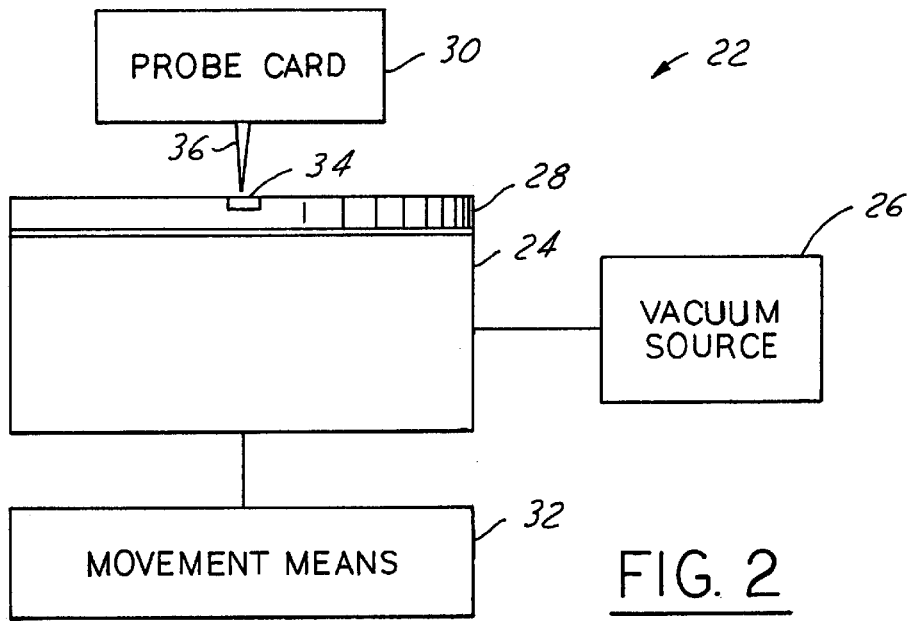
FIG. 2 is a diagrammatic view of a prober.

Referring now to the drawings wherein like reference numerals are used to identify identical components in the various views, FIG. 2 shows a diagrammatic view of a prober 22 that may be utilized for practicing the present invention. Prober 22 may include a chuck 24, a vacuum source 26, a semiconductor wafer 28, a probe card 30, and a movement means 32.

Chuck 24 is provided to fixedly hold wafer 28 through the use of a vacuum force. An inventive chuck will be described in further detail hereinafter.

Vacuum source 26 is provided to supply a predetermined level of vacuum to chuck 24. Vacuum source is conventional in the art and will not be described in any further detail hereinafter.

Semiconductor wafer 28 includes a plurality of semiconductor die 34, each of which requires testing during manufacturing. The plurality of semiconductor die 34 are tested using a test system (not shown) that applies electrical signals to die 34.

Probe card 30 provides an interface between the test system (not shown) and the plurality of test pads (not shown in FIG. 2) on each die 34. Probe card 30 is conventional in the art and includes a probe board (not shown) and a plurality of probe needles 36 configured to contact a plurality of test pads. Probe needles 36 are conductive and transmit electrical signals from the test system to the plurality of test pads on each die 34. FIG. 2 shows probe card 30 with one probe needle 36 testing one semiconductor die 34 at a time. However, it should be understood that a plurality of semiconductor die may be tested with a probe card containing a plurality of probe needles.

Movement means 32 is provided for moving chuck 24 and wafer 28 relative to probe needles 36. Means 32 may comprise an X axis motor (not shown), a Y axis motor (not shown), and a Z axis motor (not shown). In a preferred embodiment, each of the motors are servo AC motors having a movement resolution of 0.25 microns. Each of the motors are driven by electrical signals well known to those skilled in the semiconductor field.

Figure 3:
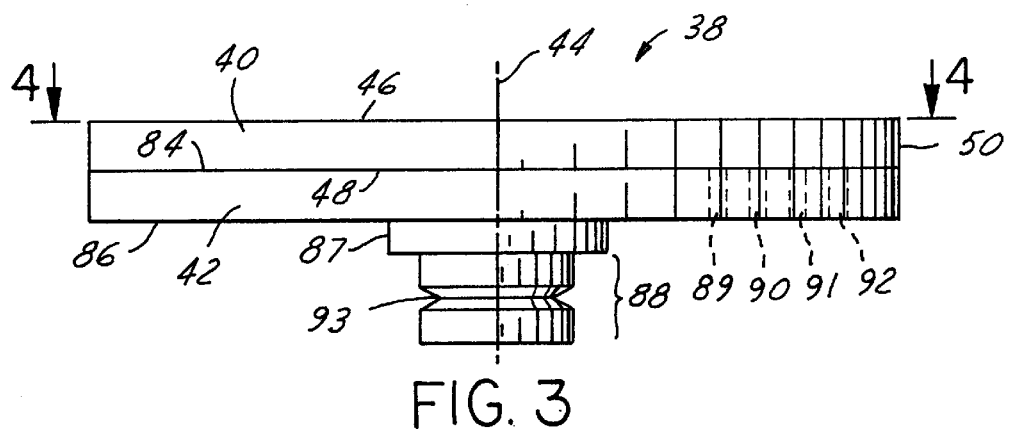
FIG. 3 is a front view of a chuck in accordance with a first embodiment of the present invention.

Referring to FIG. 3, a chuck 38 for holding a semiconductor wafer in accordance with a first embodiment of the present invention is illustrated. It should be understood that chuck 38 may be used to hold parts other than semiconductor wafers. Chuck 38 may include a chuck plate 40 and a seal plate 42.

Chuck plate 40 is provided to support and fixedly hold a semiconductor wafer. Plate 40 may be constructed from a plurality of materials including metals such as aluminum and steel, plastics, and various types of ceramics such as alumina ("aluminum oxide"). Preferably, plate 40 is constructed from alumina or zirconia that have low thermal expansion properties and provide minimal transmission of electrical noise. Plate 40 may be constructed a plurality of diameters that may correspond to the largest diameter of the wafer to be fixedly held thereto. It should be understood that plate 40 may be constructed in a plurality of alternate shapes other than the illustrated cylindrical shape. As shown in FIG. 5, plate 40 is disposed about first axis 44 and has a first side 46, a second side 48, a chuck plate outer wall 49, and a chuck plate inner side 52. Chuck plate outer wall 49 is disposed between side 46 and side 48 and extends circumferentially around plate 40. Wall 49 includes a first outer wall side 50 and a second outer wall side 51. Chuck plate inner side 52 may be substantially parallel with side 46 and disposed between side 46 and side 48. Referring now to FIGS. 5 and 6, plate 40 may further include a first chuck plate vacuum reservoir 53, a first contact region 56, a first groove 58, a first plurality of vacuum holes 60, a second contact region 62, a second groove 64, and a second plurality of vacuum holes 66.

Referring to FIG. 5, first chuck plate vacuum reservoir 53 provides a path for air to flow from first plurality of vacuum holes 60 to a vacuum source (not shown). Reservoir 53 may define a void that extends from side 48 of plate 40 into plate 40 to chuck plate inner side 52. Reservoir 53 may be generally cylindrical in shape or a plurality of alternate shapes. Alternately, reservoir 53 may be replaced by a plurality of vacuum reservoirs (not shown) extending from side 48 of plate 40 into plate 40.

Figure 4:
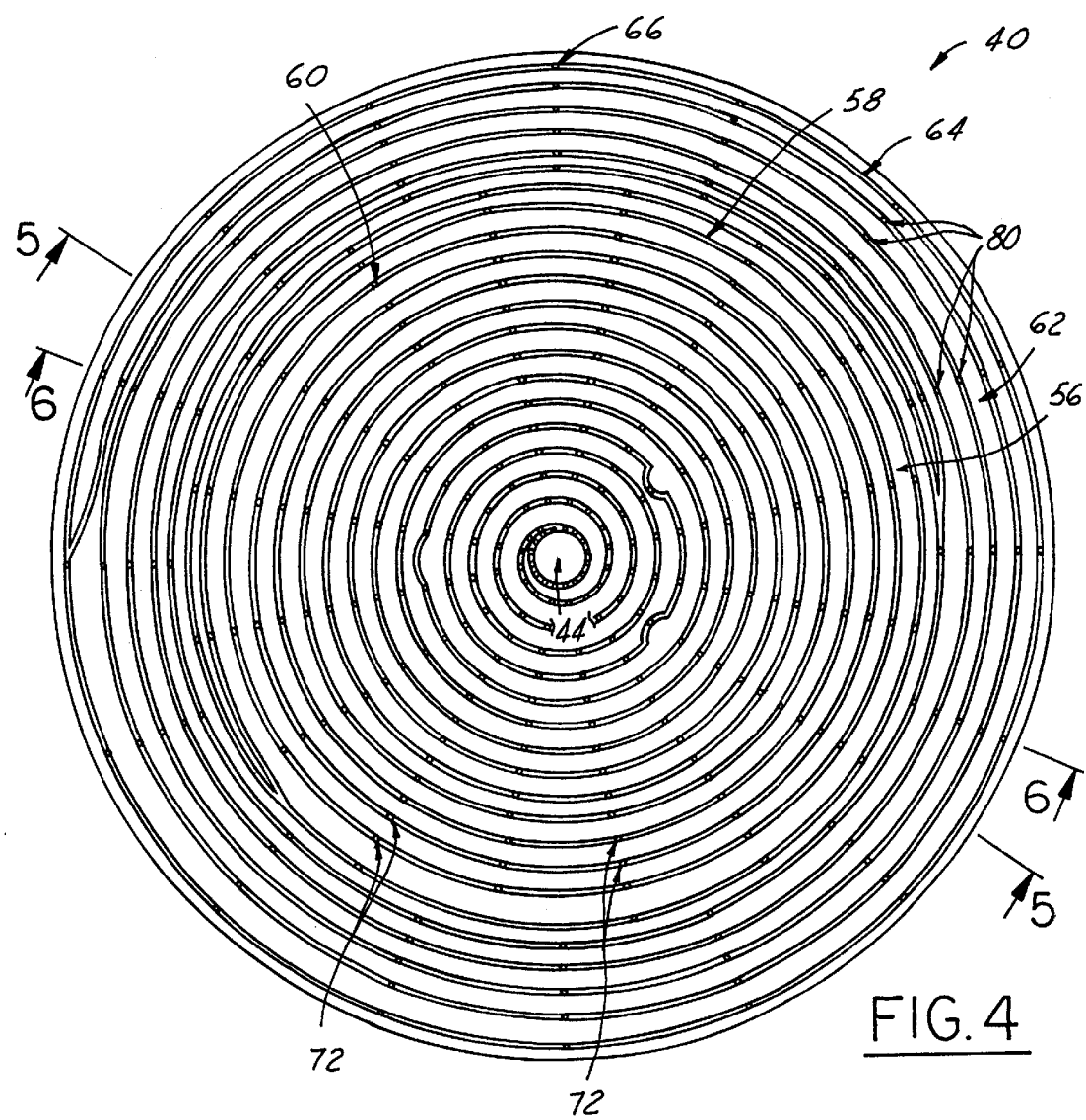
FIG. 4 is a top view of the chuck plate for the chuck shown in FIG. 3.

Referring now to FIG. 4, first contact region 56 is provided to support a semiconductor wafer (not shown) and fixedly hold the wafer flat thereto. Region 56 is disposed on first side 46 (see FIG. 5) of plate 40. Region 56 is a substantially flat region and preferably has a planarity of 400±100 Å. Region 56 may be constructed in a plurality of shapes but is preferably substantially annular shaped corresponding to the shape of a conventional semiconductor wafer.

Referring to FIG. 5, first groove 58 provides a path for air to flow from first contact region 56 to first plurality of vacuum holes 60 to thereby create a suction force on a wafer (not shown in FIG. 4) disposed on region 56. Groove 58 may be disposed within region 56 and extend from side 46 into plate 40. Groove 58 may be constructed in a plurality of shapes. For example, groove 58 may comprise a substantially circular groove (not shown) or a plurality of substantially concentric circular grooves (not shown). Additionally, the width, depth and cross-sectional configuration of groove 58 may be varied to adjust the amount of air flow therethrough as is well known to those skilled in the art. A preferred cross-sectional configuration of first groove 58 is shown in FIG. 5A. Preferably, groove 58 may extend generally spirally outwardly from a first location 68 proximate to axis 44 to a second location 70 within first contact region 56. It should be understood that a groove extending generally spirally outwardly may encompass any continuous groove that generally winds around a central point while generally receding from the central point. For example, a groove extending generally spirally outwardly may have a generally rectangular or triangular spiral shape (not shown).

First plurality of vacuum holes 60 provides a path for air to flow from first groove 58 to first chuck plate vacuum reservoir 53. Holes 60 may extend from groove 58 into plate 40. More specifically, holes 60 may extend from groove 58 to reservoir 53. It should be understood that the number, diameter, and placement of holes 60 may be varied in accordance with the teachings of the present invention depending upon the suction force desired between a wafer (not shown) and first contact region 56. Holes 60 may comprise a first plurality of hole sets 72 (see FIG. 4). One hole set 74 of hole sets 72 is enclosed by phantom lines in FIG. 5. Referring now to FIG. 4, each of hole sets 72 may be aligned substantially linearly radially outwardly from axis 44. Hole sets 72 may be angularly spaced around axis 44 substantially equidistant from one another at a first angular distance.

Second contact region 62 is provided to support a semiconductor wafer having a diameter larger than the diameter of first contact region 56 and to fixedly hold the wafer flat thereto. Region 62 is disposed on first side 46 (see FIG. 3) of plate 40 around the periphery of region 56. Region 62 is a substantially flat region and preferably has a planarity of 400±100 Å. Region 62 may be constructed in a plurality of shapes but is preferably a generally annular-shaped area.

Referring to FIG. 6, second groove 64 provides a path for air to flow from second contact region 62 to second plurality of vacuum holes 66 to thereby create a suction force on a wafer (not shown in FIG. 5) disposed on region 62. Groove 64 may be disposed within region 62 and extend from side 46 into plate 40. Groove 64 may be constructed in a plurality of shapes. For example, groove 64 may comprise a substantially circular groove (not shown) or a plurality of substantially concentric circular grooves (not shown). Additionally, the width and depth of groove 64 may be varied to adjust the amount of air flow therethrough as is well known to those skilled in the art. Groove 64 may extend generally spirally outwardly from a third location 76 to a fourth location 78 within region 62.

Second plurality of vacuum holes 66 provides a path for air to flow from second groove 64 to first chuck plate vacuum reservoir 53. Holes 66 may extend from groove 64 into plate 40. More specifically, holes 66 may extend from groove 64 to reservoir 53. It should be understood that the number, diameter, and placement of holes 66 may be varied in accordance with the teachings of the present invention depending upon the suction force desired between a wafer (not shown in FIG. 6) and second contact region 62. Referring to FIG. 4, holes 66 may comprise a second plurality of hole sets 80. Referring to FIG. 6, one hole set 82 of hole sets 80 is enclosed by phantom lines. Referring to FIG. 4, each hole set of hole sets 80 may be aligned substantially linearly radially outwardly from axis 44. Hole sets 80 may be angularly spaced around axis 44 substantially equidistant from one another at a second angular distance.

Referring again to FIG. 3, seal plate 42 is provided to seal against chuck plate 40 to enclose first chuck plate vacuum reservoir 53 (see FIG. 5). Plate 42 may be constructed from a plurality of materials including metals such as aluminum and steel, plastics, and various types of ceramics such as alumina. Preferably, plate 42 is constructed from alumina or zirconia that have low thermal expansion properties and provide minimal transmission of electrical noise. Plate 42 has a third side 84 and a fourth side 86 opposite side 84 and is preferably generally cylindrical in shape. Side 84 of plate 42 may be integral with side 48 of chuck plate 40. Alternately, side 84 of plate 42 may be fixedly attached to side 48 of plate 40 utilizing ceramic glazing or high temperature glue.

Seal plate 42 may further include an extension portion 87, a navel portion 88, and seal plate inlet holes 89, 90, 91, and 92. Portion 87 may be integral with side 86 of plate 42 and may extend axially outwardly from plate 42. Portion 87 is preferably generally cylindrical in shape. Navel portion 88 is provided to engage a stem portion (not shown) of a prober (not shown in FIG. 3). Portion 88 may be integral with portion 87 and extend axially outwardly from portion 87. Portion 88 may include a triangular shaped groove 93 disposed circumferentially around portion 88 to receive a screw (not shown) to fasten plate 42 to a stem of a prober.

Seal plate inlet holes 89, 90, 91, 92 shown in dashed lines in FIG. 3, may provide a path for air to flow from first chuck plate vacuum reservoir 53 (see FIG. 5) to a vacuum source (not shown). Inlet holes 89, 90, 91, 92 may extend through plate 42 from side 84 to side 86. It should be understood that the number, diameter, and placement of holes 89, 90, 91, 92 may be varied in accordance with the teachings of the present invention depending upon the suction force desired between a wafer (not shown) and region 56 and region 62.

Referring to FIG. 7, a chuck 94 for holding a semiconductor wafer in accordance with a second embodiment of the present invention is illustrated. Chuck 94 may include a chuck plate 40', a manifold plate 96, and seal plate 42. It should be understood that elements in the first and second embodiment of the present invention that have identical numbers are substantially the same in structure, composition, and operation and will not be described in any further detail hereinafter.

Figure 8:
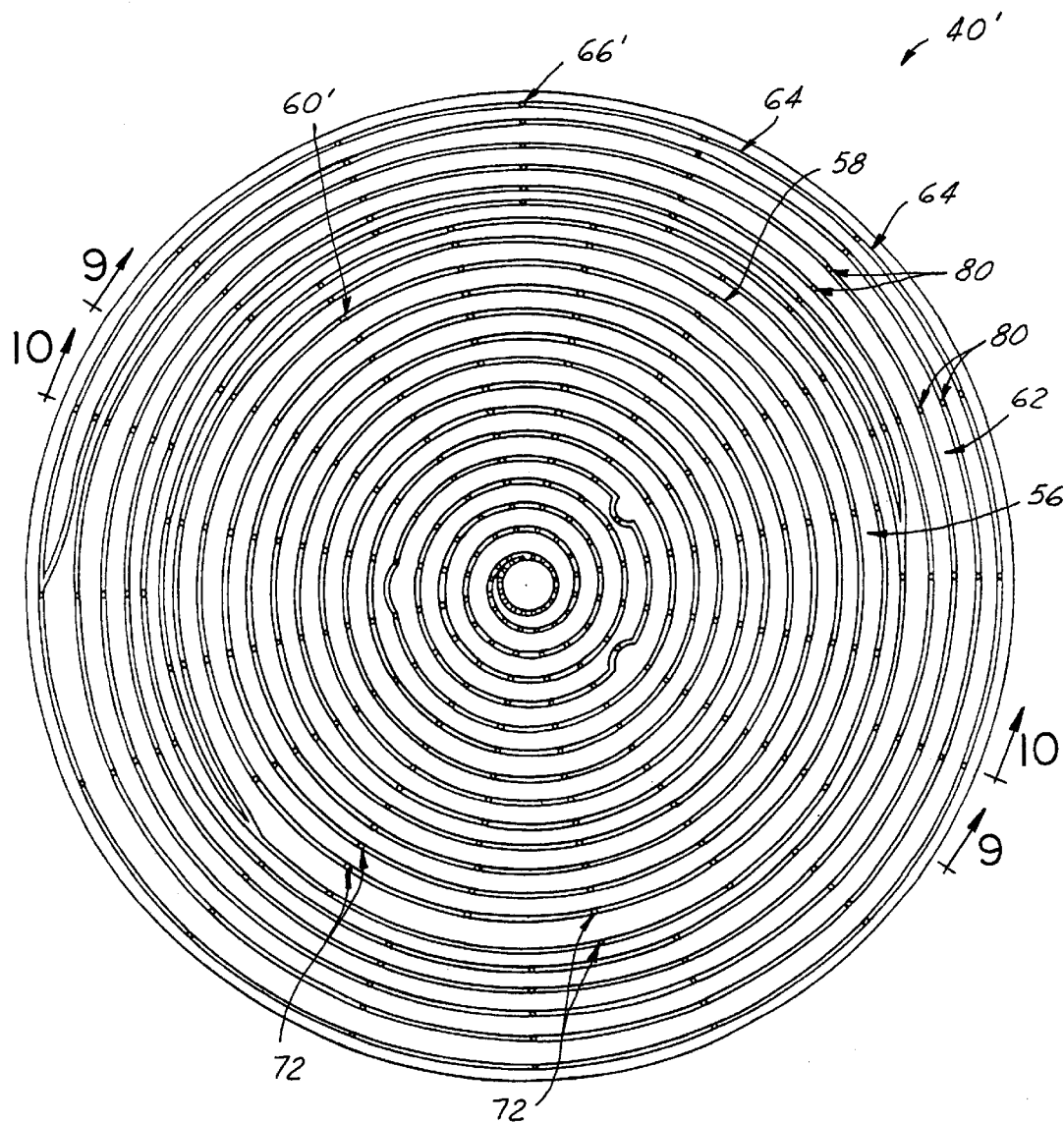
FIG. 8 is a top view of the chuck plate for the chuck shown in FIG. 7.
Figure 9:
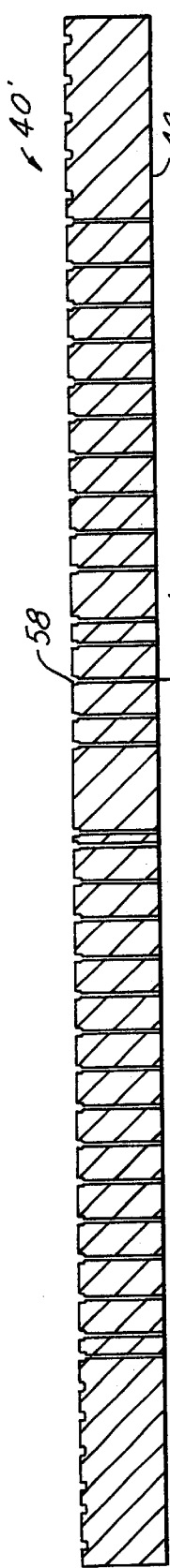
FIG. 9 is a sectional view of the chuck plate shown in FIG. 8 taken along lines 9—9.

Referring to FIGS. 8 and 9, chuck plate 40' is substantially the same as chuck plate 40 of the first embodiment of the present invention, except that plate 40' does not have first chuck plate vacuum reservoir 53 (see FIG. 5) or chuck plate inner side 52 (see FIG. 5). As shown in FIG. 9, plate 40' may have a substantially uniform axial thickness. Referring now to FIG. 8, plate 40' may include a first contact region 56, a first groove 58, a first plurality of vacuum holes 60', a second contact region 62, a second groove 64, and a second plurality of vacuum holes 66'.

Referring to FIG. 9, first plurality of vacuum holes 60' are substantially the same as first plurality of vacuum holes 60 of the first embodiment, except that holes 60' do not extend from first groove 58 to first chuck plate vacuum reservoir 53 (see FIG. 5). Instead, holes 60' extend from first groove 58 to side 48 of plate 40'.

Figure 10:
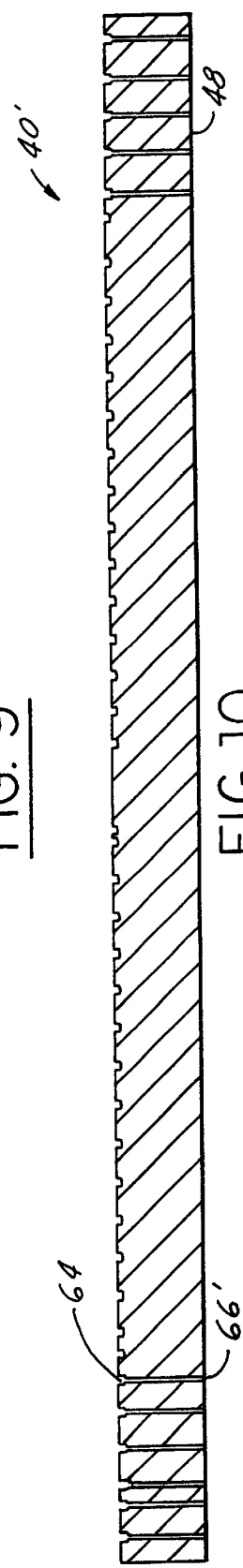
FIG. 10 is a sectional view of the chuck plate shown in FIG. 8 taken along lines 10—10.

Referring to FIG. 10, second plurality of vacuum holes 66' are substantially the same as second plurality of vacuum holes 66 of the first embodiment of the present invention, except that holes 66' do not extend from second groove 64 to first chuck plate vacuum reservoir 53 (see FIG. 6). Instead, holes 66' extend from second groove 64 to side 48 of plate 40'.

Figure 11:
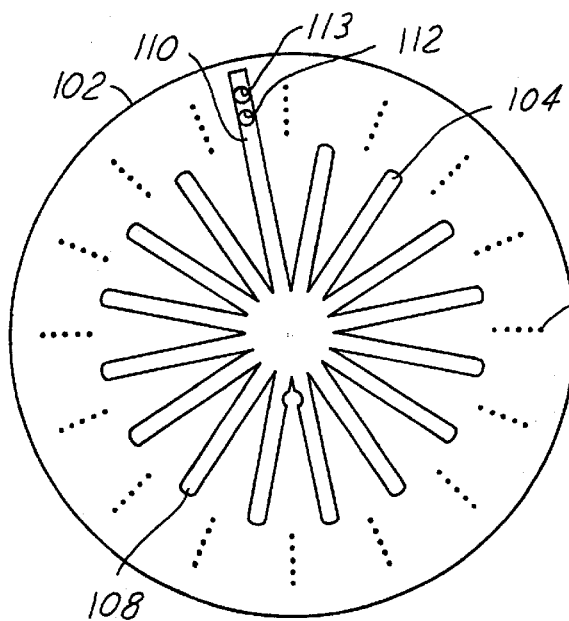
FIG. 11 is a top view of the manifold plate for the chuck shown in FIG. 7 taken along lines 11—11.
Figure 12:
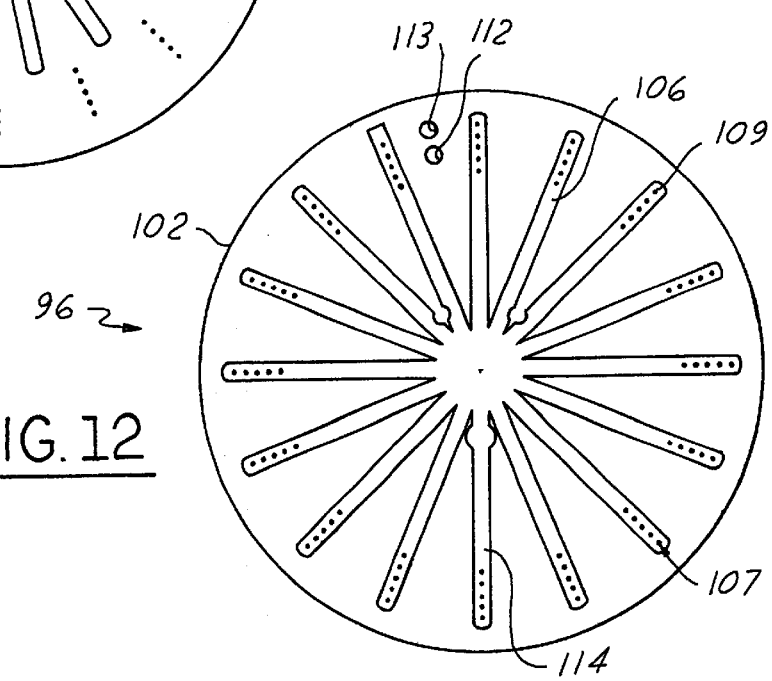
FIG. 12 is a bottom view of the manifold plate for the chuck shown in FIG. 7 taken along lines 12—12.

Referring to FIG. 7, manifold plate 96 is provided to seal against chuck plate 40' and to channel air flow from plate 40' to a vacuum source (not shown). Plate 96 may be constructed from a plurality of materials including metals such as aluminum and steel, plastics, and various types of ceramics such as alumina. Preferably, plate 96 is constructed from alumina or zirconia that have low thermal expansion properties and provide minimal transmission of electrical noise. Plate 96 may be constructed a plurality of diameters corresponding to the diameter of plate 40'. It should be understood that plate 96 may be constructed in a plurality of alternate shapes other than the illustrated cylindrical shape in order to seal against plate 40'. As shown, plate 96 is disposed about axis 44 and has a fifth side 98, a sixth side 100 opposite side 98, and a manifold plate outer side 102 disposed between side 98 and side 100. Referring now to FIGS. 11 and 12, plate 96 may further include a first manifold plate vacuum reservoir 104, a second manifold plate vacuum reservoir 106, a first plurality of manifold vacuum holes 107, a first manifold plate inlet hole 112, and a second manifold plate inlet hole 113.

First manifold plate vacuum reservoir 104 provides a path for air to flow from first plurality of vacuum holes 60' (see FIG. 8) to a vacuum source (not shown in FIG. 11). Reservoir 104 may define a void that extends from side 98 (see FIG. 7) of plate 96 into plate 96. Reservoir 104 may be generally cylindrical in shape or any other shape that allows air to flow from holes 60' to a vacuum source.

In the second embodiment, first manifold plate vacuum reservoir 104 comprises a first plurality of manifold grooves 108 where each of grooves 108 extend substantially linearly radially outwardly from axis 44. Each groove of grooves 108 extend to at least a radial distance corresponding to the radial distance that groove 58 (see FIG. 8) of chuck plate 40' extends from axis 44. Grooves 108 may be angularly spaced around axis 44 substantially equidistant from one another at a first angular distance corresponding to the angular spacing of first plurality of vacuum holes 60' (see FIG. 8) of chuck plate 40'. Referring now to FIG. 7, side 98 of plate 96 may be positioned against side 48 of plate 40' so that each of grooves 108 linearly radially aligns with a corresponding hole set of first plurality of hole sets 72 (see FIG. 8) of plate 40'. It should be understood that the alignment of grooves 108 and hole sets 72 allow grooves 108 and hole sets 72 to be in fluid communication with one another. Referring now to FIG. 11, one groove 110 of grooves 108 may extend radially outwardly a greater radial distance that the other grooves of grooves 108.

Referring now to FIG. 12, second manifold plate vacuum reservoir 106 provides a path for air to flow from second plurality of vacuum holes 66' (see FIG. 8) of chuck plate 40' to a vacuum source (not shown in FIG. 12). Reservoir 106 may define a void that extends from side 100 of manifold plate 96 into plate 96. Reservoir 106 may be generally cylindrical in shape or any other shape that allows air to flow from holes 66' to a vacuum source.

In the second embodiment, second manifold plate vacuum reservoir 106 comprises a second plurality of manifold grooves 114 where each of grooves 114 extend substantially linearly radially outwardly from axis 44. Each of grooves 114 extend from axis 44 to preferably at least a radial distance corresponding to the radial distance that second groove 64 (see FIG. 8) of chuck plate 40' extends from axis 44. Grooves 114 may be angularly spaced around axis 44 substantially equidistant from one another at a second angular distance corresponding to the angular spacing of second plurality of vacuum holes 66' (see FIG. 8) of chuck plate 40'.

Referring to FIG. 12, first plurality of manifold vacuum holes 107 provide a path for air to flow from second plurality of vacuum holes 66' (see FIG. 8) of chuck plate 40' to second plurality of manifold grooves 114. Holes 107 extend from side 98 (see FIG. 7) of plate 96 to grooves 114. It should be understood that the number, diameter, and placement of holes 107 may be varied in accordance with the teachings of the present invention depending upon the suction force desired between a wafer (not shown in FIG. 12) and second contact region 62 (see FIG. 8). Holes 107 may comprise a first plurality of manifold hole sets 109.

First manifold plate inlet hole 112 and second manifold plate inlet hole 113 may be provided to allow air to flow from reservoir 104 to inlet holes 89, 90 (see FIG. 7). Hole 112 and hole 113 may extend from groove 110 to side 100 of plate 96. Hole 112 may be in fluid communication with inlet hole 89. Hole 113 may be in fluid communication with inlet hole 90. It should be understood that the number, diameter, and placement of hole 112 and hole 113 may be varied in accordance with the teachings of the present invention.

Referring now to FIG. 7, side 98 of manifold plate 96 may be positioned against side 48 of chuck plate 40' so that each of grooves 114 (see FIG. 12) linearly radially aligns with a corresponding hole set of second plurality of hole sets 80 (see FIG. 8) of plate 40'. It should be understood that in addition to the radial alignment of grooves 114 (see FIG. 12) and second hole sets 80 (see FIG. 8), that each hole set of hole sets 80 may axially align with a corresponding hole set of first plurality of manifold holes sets 109 to be in fluid communication therewith.

Referring to FIG. 7, seal plate 42 is provided to seal against manifold plate 96 to enclose second manifold plate vacuum reservoir 106 (see FIG. 12). Side 84 of plate 42 may be integral with side 100 of plate 96. Alternately, side 84 of plate 42 may be fixedly attached to side 100 of plate 96 utilizing a ceramic glazing or a high temperature glue.

Referring again to FIG. 12, inlet holes 91, 92 may be positioned through plate 42 to be in fluid communication with reservoir 106 when plate 42 (see FIG. 7) is sealed against plate 96. The vacuum source (not shown) may be connected to inlet holes 91, 92.

Figure 13:
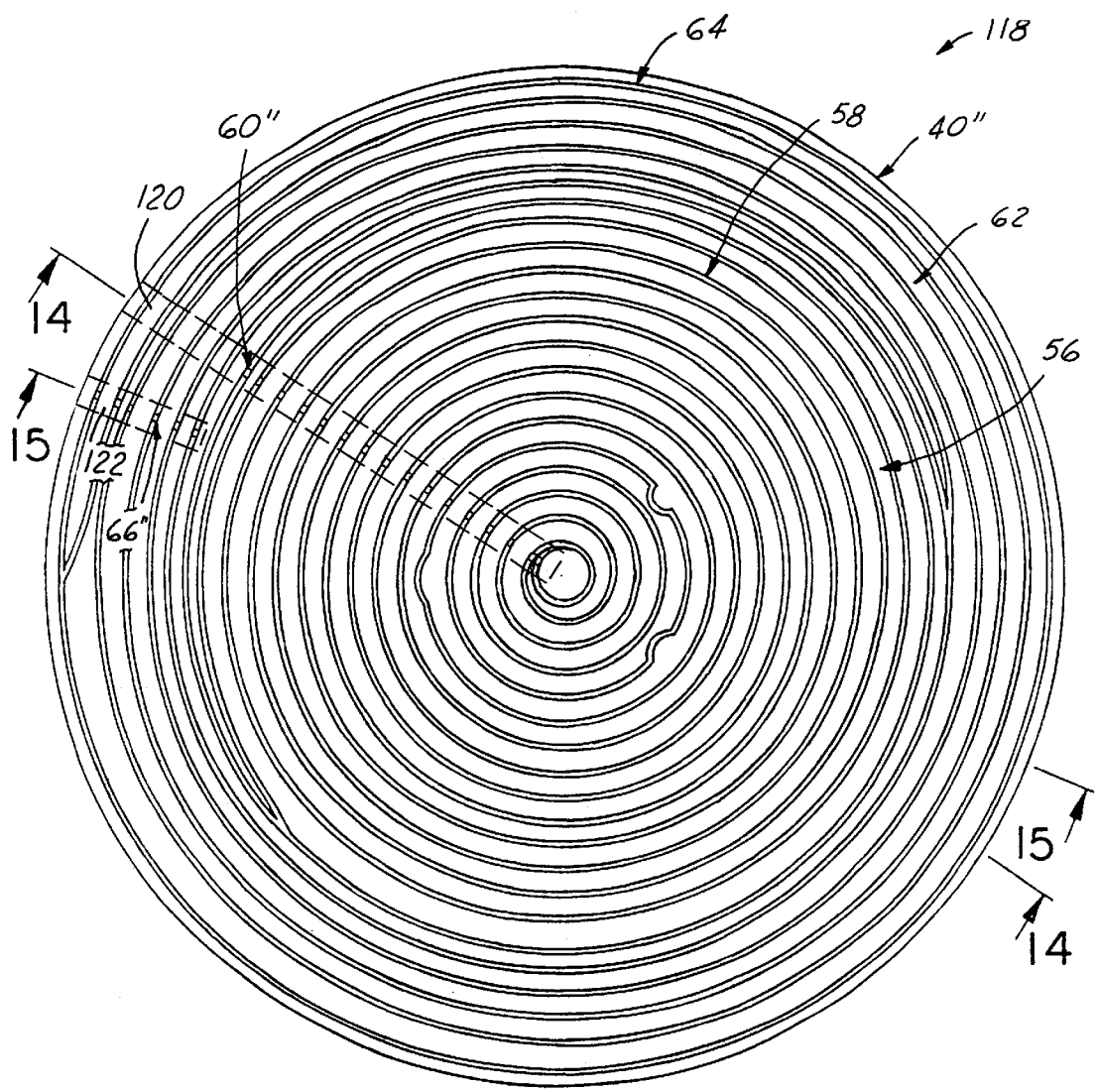
FIG. 13 is a top view of a chuck in accordance with a third embodiment of the present invention.

Referring to FIG. 13, a chuck 118 for holding a semiconductor wafer in accordance with a third embodiment of the present invention is illustrated. It should be understood that elements in the first and third embodiments of the present invention that have identical numbers are substantially the same in structure, composition, and operation and will not be described in any further detail hereinafter. Chuck 118 may include a chuck plate 40".

Figure 14:
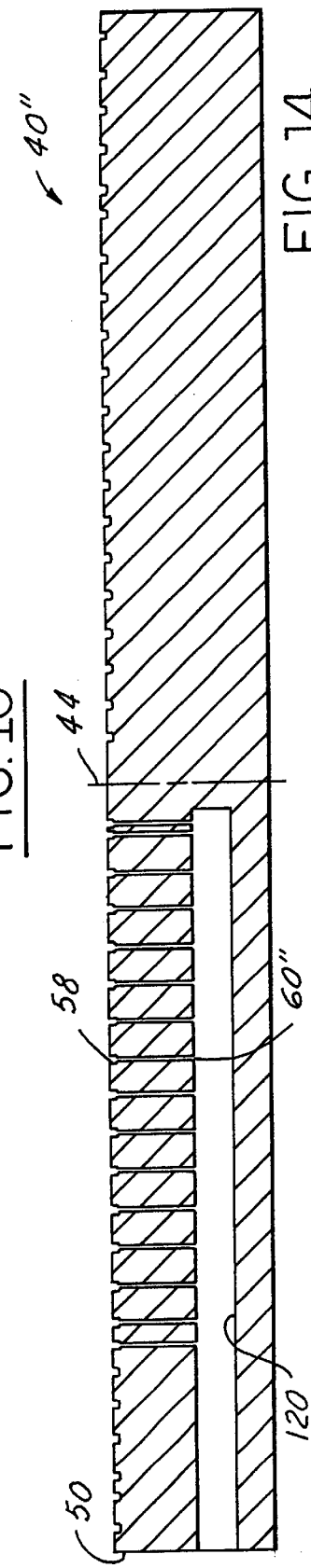
FIG. 14 is a sectional view of the chuck shown in FIG. 13 taken along lines 14—14.
Figure 15:
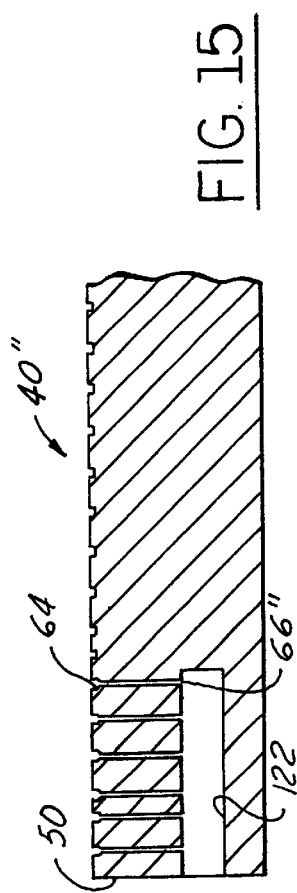
FIG. 15 is a partial sectional view of the chuck shown in FIG. 13 taken along lines 15—15.

Referring to FIGS. 14 and 15, chuck plate 40" is substantially the same as chuck plate 40 of the first embodiment of the present invention, except plate 40" does not have first chuck plate vacuum reservoir 53 (see FIG. 5) or chuck plate inner side 52. As shown, plate 40" may have a substantially uniform axial thickness. Referring now to FIG. 13, plate 40" may include a first contact region 56, a first groove 58, a first chuck plate inlet hole 120, a first plurality of vacuum holes 60", a second contact region 62, a second groove 64, a second chuck plate inlet hole 122, and a second plurality of vacuum holes 66".

Referring to FIG. 14, hole 120 is provided to allow air to flow from first plurality of vacuum holes 60" to a vacuum source (not shown in FIG. 14). Hole 120 may be constructed in a plurality of shapes capable of allowing air to flow therethrough. Hole 120 may be disposed within plate 40" and may extend radially linearly outwardly from axis 44 to first outer wall side 50 to allow a vacuum source to be attached therein.

First plurality of vacuum holes 60" are substantially the same as first plurality of vacuum holes 60 of the first embodiment, except that holes 60" do not extend from first groove 58 to first chuck plate vacuum reservoir 53 (see FIG. 5). Instead, holes 60" may extend from first groove 58 to hole 120. Additionally, holes 60" are fewer in number and disposed in a smaller region of first contact region 56 than holes 60 (see FIG. 4).

Referring now to FIG. 15, hole 122 is provided to allow air to flow from second plurality of vacuum holes 66" to a vacuum source (not shown in FIG. 15). Hole 122 may be constructed in a plurality of shapes capable of allowing air to flow therethrough. Hole 122 may be disposed within plate 40" and may extend radially linearly outwardly from axis 44 to first outer wall side 50 to allow a vacuum source to be attached therein.

Second plurality of vacuum holes 66" are substantially the same as second plurality of vacuum holes 66 of the first embodiment of the present invention, except that holes 66" do not extend from second groove 64 to first chuck plate vacuum reservoir 53 (see FIG. 5). Instead, holes 66" may extend from second groove 64 to hole 122. Additionally, holes 66" are fewer in number and disposed in a smaller region of second contact region 62 than holes 66.

Figure 16:
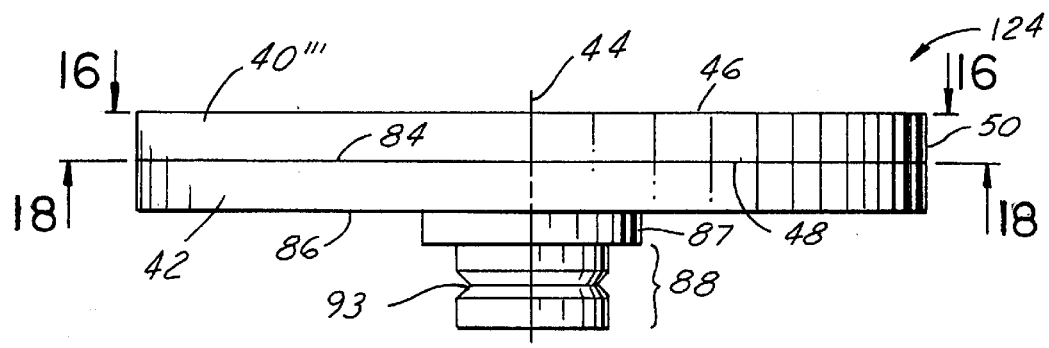
FIG. 16 is a front view of a chuck in accordance with a fourth embodiment of the present invention.

Referring to FIG. 16, a chuck 124 for holding a semiconductor wafer in accordance with a fourth embodiment of the present invention is illustrated. Chuck 124 may include a chuck plate 40''', and a seal plate 42. It should be understood that elements in the first and fourth embodiment of the present invention that have identical numbers are substantially the same in structure, composition, and operation and will not be described in any further detail hereinafter.

Figure 17:
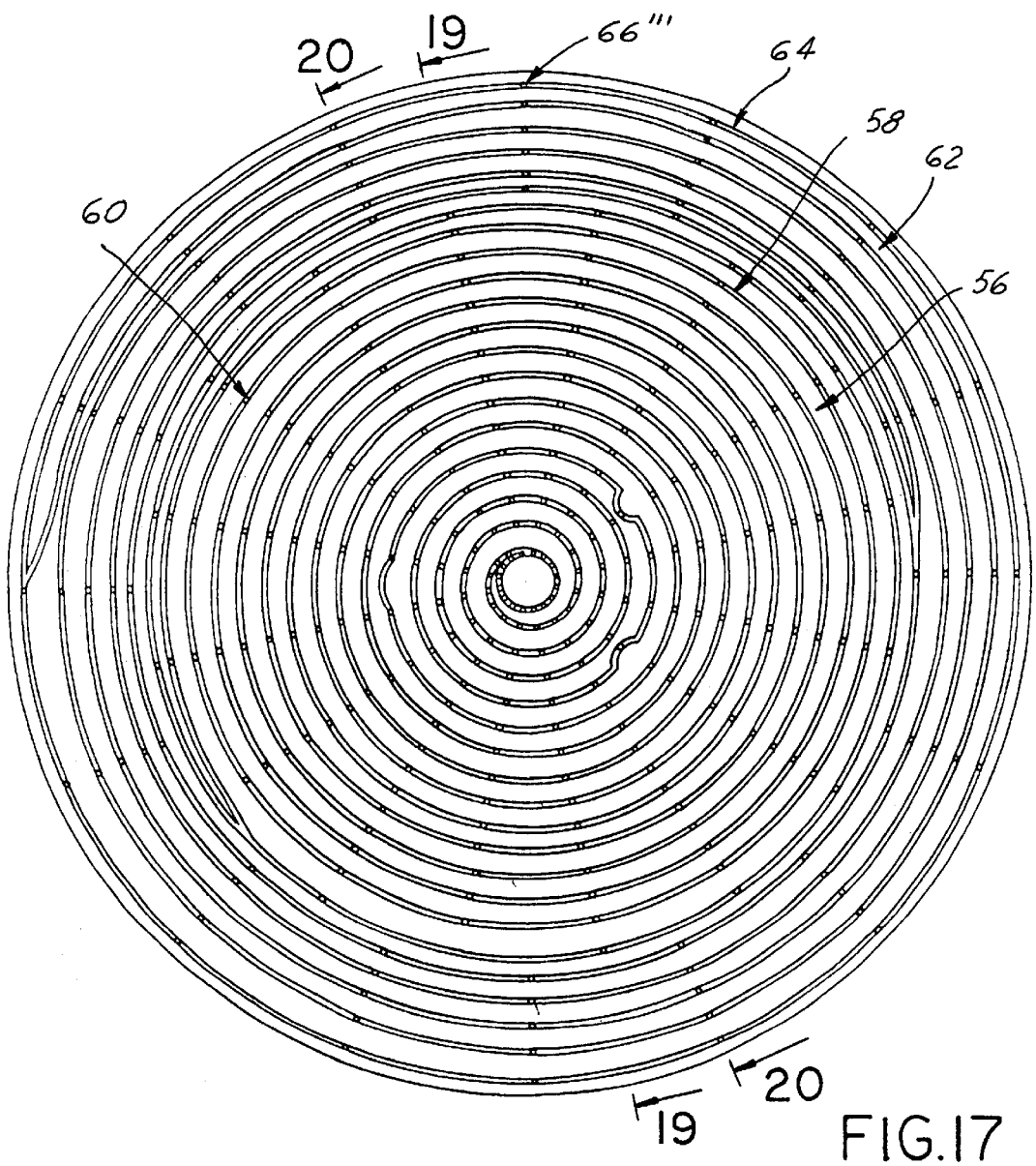
FIG. 17 is a top view of the chuck shown in FIG. 16.
Figure 18:
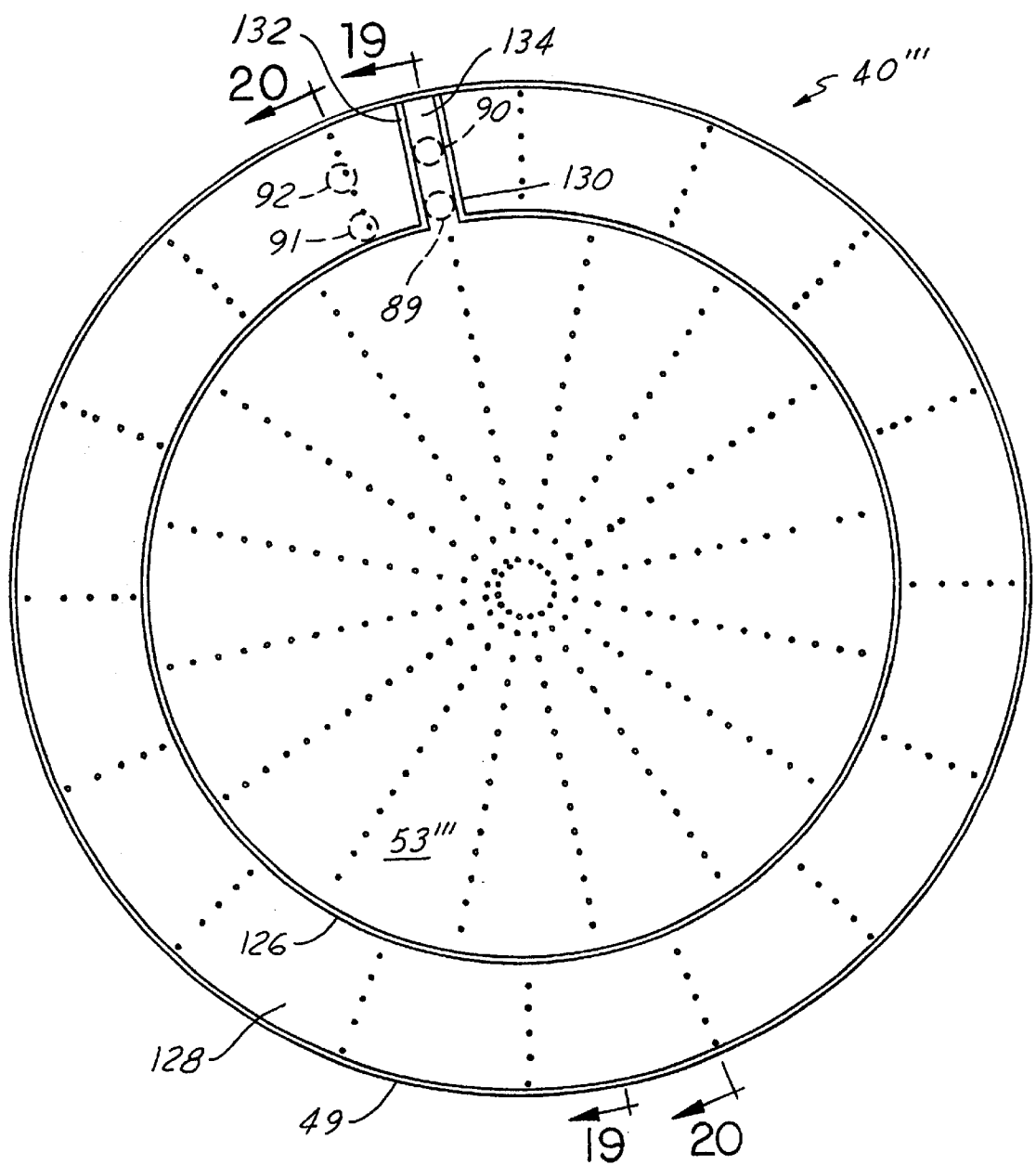
FIG. 18 is a bottom view of the chuck plate for the chuck shown in FIG. 16 taken along lines 18—18.
Figure 19:
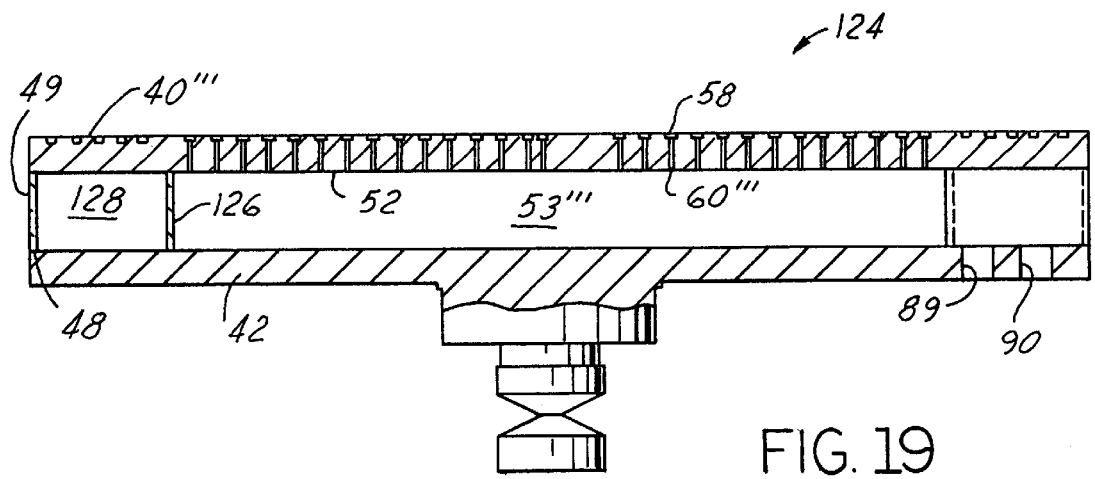
FIG. 19 is a sectional view of the chuck shown in FIG. 17 taken along lines 19—19.

Referring to FIGS. 18 and 19, chuck plate 40''' is substantially the same as chuck plate 40 of the first embodiment of the present invention, except that plate 40''' further includes a chuck plate inner wall 126 and a second chuck plate vacuum reservoir 128. Referring now to FIGS. 17 and 19, plate 40''' may include a chuck plate outer wall 49, a chuck plate inner side 52, a first contact region 56, a first groove 58, a first plurality of vacuum holes 60, a second contact region 62, a second groove 64, a chuck plate inner wall 126, a first chuck plate vacuum reservoir 53''', a second chuck plate vacuum reservoir 128, and a second plurality of vacuum holes 66'''.

Referring to FIG. 18, chuck plate inner wall 126 is provided to separate first chuck plate vacuum reservoir 53''' and second chuck plate vacuum reservoir 128. Referring to FIG. 19, wall 126 may be substantially uniform in thickness and may extend from chuck plate inner side 52 axially outwardly. Referring to FIG. 18, wall 126 may be substantially annularly shaped and include a first end portion 130 and a second end portion 132. Portion 130 and portion 132 may extend to chuck plate outer wall 49 to define an inlet region 134. The preferable position of seal plate inlet holes 89, 90, 91, 92 with respect to plate 40''' is indicated by the dashed circles 89, 90, 91, 92, respectively.

First chuck plate vacuum reservoir 53''' is substantially the same as first chuck plate vacuum reservoir 53 of the first embodiment of the present invention. The primary difference between reservoir 53''' and reservoir 53 is that reservoir 53''' is enclosed by chuck plate inner wall 126 rather than chuck plate outer wall 49. It should be understood that reservoir 53''' is in fluid communication with inlet holes 89, 90, respectively.

Second chuck plate vacuum reservoir 128 provides a path for air to flow from second plurality of vacuum holes 66''' to inlet holes 91, 92. Reservoir 128 may define a void that extends from side 48 of chuck plate 40''' into plate 40''' to chuck plate inner side 52. Reservoir 128 is enclosed between chuck plate inner wall 126 and chuck plate outer wall 49 and may be generally split-ring shaped.

Figure 20:
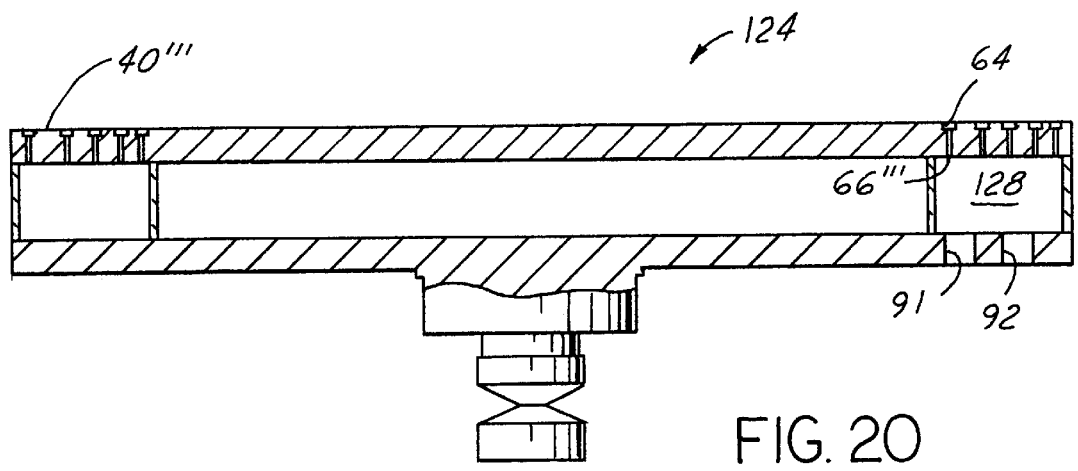
FIG. 20 is a sectional view of the chuck shown in FIG. 17 taken along lines 20—20.

Referring to FIG. 20, second plurality of vacuum holes 66''' are substantially the same as second plurality of vacuum holes 66 of the first embodiment of the present invention. The primary difference between holes 66''' and holes 66 is that holes 66''' extend from second groove 64 to second chuck plate vacuum reservoir 128 instead of from second groove 64 to first chuck plate vacuum reservoir 53.

Referring to FIG. 19, seal plate 42 is provided to seal against chuck plate 40''' to enclose reservoir 53''' and second reservoir 128. Plate 42 may be positioned against plate 40''' so that inlet holes 89, 90 are in fluid communication with inlet region 134 of reservoir 53'''. Referring to FIG. 20, plate 42 may also be positioned against plate 40''' so that inlet holes 91, 92 are in fluid communication with reservoir 128.

Referring to FIGS. 3, 5, 6, a method of operating chuck 38 includes two steps. The first step involves placing a wafer on chuck 38. The second step involves applying a vacuum at a predetermined level, preferably at 27 inches Hg, to inlet holes 89, 90, 91, 92. The predetermined vacuum level applied to inlet holes 89, 90, 91, 92 causes air to flow from groove 58 through holes 60 and further through reservoir 53 and inlet holes 89, 90, 91, 92 to the vacuum source (not shown). Furthermore, the predetermined vacuum level applied to inlet holes 89, 90, 91, 92 causes air to flow from groove 64 through holes 66 and further through reservoir 53 and inlet holes 89, 90, 91, 92 to the vacuum source (not shown). The air flow through groove 58 creates a first suction force between the wafer (not shown) and first contact region 56. If the wafer has a diameter large enough to cover a portion of second contact region 62, the air flow through groove 64 creates a second suction force between the wafer and second contact region 62. The first and second suction force causes the wafer to be forced downward until the entire bottom surface of the wafer contacts with chuck 38. An advantage of the generally spiral configuration of groove 58 (see FIG. 4) and groove 64, is that a non-flat wafer contacting chuck 38 only on the outer edges of the wafer will be "walked down" on chuck 38 steadily inwardly towards axis 44. Alternately, a non-flat wafer contacting a central radial area of chuck 38 will be "walked down" on chuck 38 steadily outwardly from axis 44. It should be understood that a substantially flat wafer may also be fixedly held against chuck 38 by the first and second suction force.

Referring to FIG. 7, a method of operating chuck 94 includes two steps. The first step involves placing a wafer (not shown) on chuck 94. Referring to FIGS. 7 and 11, the second step involves applying a vacuum at a predetermined level, preferably 27 inches Hg, to inlet holes 89, 90 that are in fluid communication with first manifold plate reservoir 104, to allow air flow in first contact region 56 (see FIG. 8). Referring to FIGS. 7 and 12, the method may further include a third step involving applying a source vacuum to inlet holes 91, 92 that are in fluid communication with second manifold plate reservoir 106, to allow air flow in second contact region 62 (see FIG. 8).

Referring now to FIGS. 7, 9, 11, a predetermined vacuum level applied to inlet holes 89, 90 causes air to flow from groove 58 through first plurality of vacuum holes 60' and further through first manifold plate vacuum reservoir 104. From reservoir 104 the air flows through hole 112 and hole 113. From hole 112, the air flows through inlet hole 89 to the vacuum source. From hole 113, the air flows through inlet hole 90 to the vacuum source.

Referring now to FIGS. 7, 10, 12, a predetermined vacuum level applied to inlet holes 91, 92 causes air to flow from groove 64 through second plurality of vacuum holes 66' and first plurality of manifold vacuum holes 107 and further through second manifold plate vacuum reservoir 106. From reservoir 106, the air flows through inlet holes 91, 92 to the vacuum source (not shown). As previously discussed, a first and second suction force will be created between the wafer and region 56 and region 62, respectively. The first and second suction force will enable a non-flat wafer to be "walked down" on chuck 94. A substantially flat wafer may also be fixedly held against chuck 94 by the first and second suction force.

Referring to FIG. 13, a method of operating chuck 118 includes two steps. The first step involves placing a wafer (not shown) on chuck 118. Referring to FIG. 14, the second step involves applying a source vacuum at a predetermined level, preferably 27 inches Hg, to first chuck plate inlet hole 120.

The predetermined vacuum level applied to hole 120 causes air to flow from groove 58 through first plurality of vacuum holes 60" and further through hole 120 to the vacuum source (not shown). Referring to FIG. 15, a predetermined vacuum level applied to second chuck plate inlet hole 122 causes air to flow from groove 64 through second plurality of vacuum holes 66" and further through hole 122 to the vacuum source (not shown). As previously discussed, a first and second suction force will be created between the wafer and region 56 and region 62, respectively. The first and second suction force will enable a non-flat wafer to be "walked down" on chuck 118. A substantially flat wafer may also be fixedly held against chuck 118 by the first and second suction force.

Referring to FIGS. 19 and 20, a method of operating chuck 124 includes two steps. The first step involves placing a wafer on chuck 124. The second step involves applying a vacuum at a predetermined level, preferably at 27 inches Hg, to inlet holes 89, 90 to cause air flow through first chuck plate vacuum reservoir 53′″. The method may further include a third step involving applying a source vacuum to inlet holes 91, 92 to allow air flow in second contact region 62.

Referring to FIG. 19, a predetermined vacuum level applied to inlet holes 89, 90 causes air to flow from groove 58 through first plurality of vacuum holes 60′″ to first chuck plate vacuum reservoir 53′″. From reservoir 53′″ the air flows through inlet holes 89, 90 to the vacuum source. Referring to FIG. 20, a predetermined vacuum level applied to inlet holes 91, 92 causes air to flow from groove 64 through second plurality of vacuum holes 66′″ to second chuck plate vacuum reservoir 128. From reservoir 128 the air flows through inlet holes 91, 92 to the vacuum source. As previously discussed, a first and second suction force will be created between the wafer and region 56 and region 62, respectively. The first and second suction force will enable a non-flat wafer to be "walked down" on chuck 124. A substantially flat wafer may also be fixedly held against chuck 124 by the first and second suction force.

A method of constructing chucks 38, 94, 118, and 124, corresponding to a first, second, third, and fourth embodiment of the present invention will hereinafter be described. It should be understood that the method described below is only one of several methods that may be utilized by one skilled in the art to manufacture the present invention. The method of constructing the chucks 38, 94, 118, and 124 of the present invention comprises ten steps. The first step involves using as a starting material aluminum oxide powder that has an average particle diameter of 8–12 microns with the range of particle diameters being 2–25 microns. The aluminum oxide powder may be highly purified 99.5% or more. Sintering aids and binding aids may be added to the aluminum oxide powder prior to baking as is well known in the art. The second step involves forming the above-mentioned starting powder into ceramic green billets utilizing an isostatic press that subjects the starting powder to at least a 7000 PSI pressure. It should be understood that a separate green billet must be formed to manufacture each chuck plate 40, 40′, 40″, 40′″, manifold plate 96, and seal plate 42 of the present invention. The fourth step involves machining each green billet to include the features of chuck plate 40, 40′, 40″, 40′″, manifold plate 96, or seal plate 42. The machining step includes machining the vacuum grooves, vacuum reservoirs, and drilling the holes in the green billets, according to the teachings of the present invention. The fifth step involves baking the green billets at approximately 1650° C. to create ceramic plates corresponding to chuck plate 40, 40′, 40″, 40′″, manifold plate 96, or seal plate 42. The sixth step involves diamond grinding several features on the ceramic plates. The vacuum grooves, vacuum holes, and all sides of the ceramic plates are diamond ground according to the teachings of the present invention. The seventh step involves applying a thin nonporous glass coating over the ceramic plates corresponding to chuck plate 40, 40′, 40″, 40′″, that has a melting point lower than that of the aluminum oxide. A doping agent may be added to the glass coating material to increase the resistance of the glass coating to preferably greater than 10,000 $\Omega/in^2$. It should be understood that a plurality of doping agents may be added to the glass coating material to increase the specific resistance of the glass coating. For example, the doping agent may comprise one or more of the following chemical compounds: zirconia, silicon carbide, titungsten, silicon nitride, titanium diboride, boron carbide, aluminum titanate, tungsten carbide, and aluminum nitride. The glass coating preferably has a thickness of 100 Å or less. The eighth step involves stacking and orienting the ceramic plates that will be used to construct chucks 38, 94, or 124 according to the teachings of the first, second, or fourth embodiment of the present invention. It should be understood that a chuck 118 according to the third embodiment of the present invention is a single ceramic plate and therefore is not stacked upon any other ceramic plate. The ninth step involves baking the ceramic plates at approximately 1650° C. to construct chucks 38, 94, 118, or 124. The tenth step involves diamond grinding the top of surface of chuck 38, 94, 118, or 124 to have a planarity of 400±100 Å.

In an alternate method, the plates of chucks 38, 94, or 124 could be bonded together utilizing a high temperature glue or adhesive. More specifically, for chucks 38, 94, or 124, the seventh, eighth, and ninth steps discussed hereinabove could be replaced by glueing and stacking corresponding plates representing chuck plate 40, 40′, 40′″, manifold plate 96, and seal plate 42 together utilizing a high temperature glue or adhesive in accordance with the teachings of the present invention.

A method for probing a test pad on a semiconductor die disposed on a semiconductor wafer in accordance with the present invention will be described hereinafter. FIG. 2 shows a diagrammatic view of a prober 22 that may be utilized for practicing the inventive probing method. As discussed previously, aluminum test pads have an oxide layer that must be penetrated during the probing process to allow for adequate electrical conductivity between a probe needle and the test pad.

Referring now to FIGS. 2 and 21, the method for probing a test pad on a semiconductor die resulting in the removal of a portion of oxide layer from the test pad comprises five steps. The method includes, as shown in step 136, providing a prober 22 having a probe needle 36 and a chuck 24. It should be understood that chuck 24 could be substituted by any one of chucks 38, 94, 118, and 124. The method further includes, as shown in step 138, placing a semiconductor wafer 28 on chuck 24. The method further includes, as shown in step 140, moving chuck 24 in a vertical direction toward probe needle 36 until physical contact is made between probe needle 36 and the test pad (not shown in FIG. 2). The method further includes, as shown in step 142, overdriving chuck 24 in a vertical direction a distance less than or equal to 1 micron. The method further includes, as shown in step 144, moving probe needle 36 in four substantially linear movements defining a substantially quadrangular area while probe needle 36 is in physical contact with the test pad. It should be understood that the movement of chuck 24 will cause a corresponding movement of the test pad. During the four substantially linear movements of chuck 24, probe needle 36 may remain at a fixed location.

Figure 22:
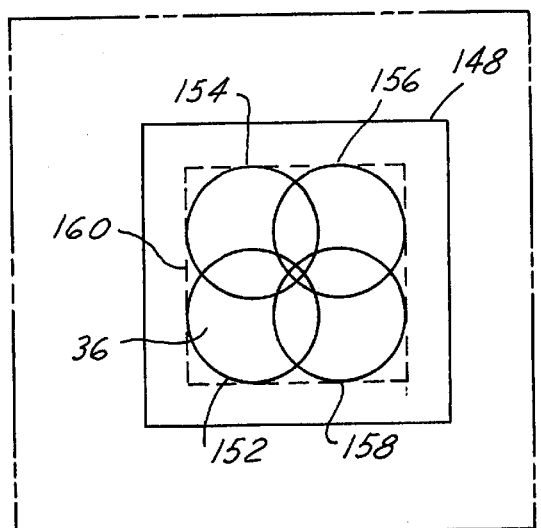
FIG. 22 is a top view of a test pad showing probe needle movement relative to the test pad in accordance with the present invention.

For a more detailed description of step 144, FIG. 22 illustrates a top view of a portion of a semiconductor die 146 including a test pad 148 and a probe needle 36. More specifically, FIG. 22 illustrates four positions on test pad 148 that probe needle 36 contacts during step 144. Probe needle 36 initially contacts test pad 148 at first position 152. From first position 152, probe needle 36 moves in sequence to second position 154, third position 156, fourth position 158, and then to first position 152. During the probe movements to positions 154, 156, 158, 152 an oxide layer disposed on test pad 148 is removed from quadrangular area 160 whose outer boundary is shown as a dashed line. Each side of quadrangular area 160 may be less than or equal to 1 micron in length. Alternately, the above-mentioned probing method may be accomplished by moving the probe needles as described above while holding chuck 24 stationary.

An advantage of the above-described probing method is that fewer movements of chuck 24 or probe needle 36 are required to remove the oxide layer on the test pad as compared with conventional methods. Essentially, four substantially linear movements are required to remove a portion of the oxide layer. Additionally, the substantially linear movements of probe needle 36 or chuck 24 of less than or equal to 1 micron are smaller than conventional probe scrubbing movements. An advantage with using the 1 micron linear movements is that smaller test pads may be used on integrated circuits. Since the size of an integrated circuit is directly dependent on the size of test pads thereon, integrated circuits may be constructed with smaller dimensions.

As described and illustrated, a chuck for holding a semiconductor wafer using a suction force in accordance with the present invention provides the ability to fixedly hold a semiconductor wafer. Such a chuck satisfies the objective of fixedly holding a flat or non-flat wafer against the chuck during testing. A method for probing a test pad on a semiconductor die in accordance with the present invention provides the ability to remove an oxide layer from a test pad to allow for an adequate electrical connection between a probe needle and the test pad. The probing method satisfies the objective of providing fewer and smaller movements of the probe needle or chuck to break through an oxide layer on the test pad as compared to conventional probing methods.

While the invention has been particularly shown and described with reference to the preferred embodiments thereof, it is well understood by those skill in the art that various changes and modifications can be made in the invention without departing from the spirit and the scope of the invention.

I claim:

1. A chuck plate assembly comprising:
   a chuck plate having a first side and a second side opposite said first side;
   said first side of said chuck plate having a central contact region and a peripheral contact region surrounding said central contact region;
   said central contact region having a spiral shaped central contact groove formed in said first side of said chuck plate;
   said peripheral contact region having a spiral shaped peripheral contact groove formed in said first side of said chuck plate;
   a first plurality of vacuum holes being disposed in said central contact groove;
   a second plurality of vacuum holes being disposed in said peripheral contact groove;
   a manifold having a first vacuum reservoir and a second vacuum reservoir;
   said first vacuum reservoir being in flow communication with said first plurality of vacuum holes;
   said second reservoir being in flow communication with said second plurality of vacuum holes;
   said central contact groove being flow isolated from said peripheral contact groove;
   whereby a vacuum can be created at said central contact region of said chuck plate prior to and independent of a vacuum created at said peripheral contact region.

2. The chuck of claim 1 wherein said chuck plate includes a first chuck plate vacuum reservoir extending from said second side into said chuck plate, said first plurality of vacuum holes extending from said first groove of said chuck plate to said first chuck plate vacuum reservoir.

3. The chuck of claim 2 wherein said first groove of said chuck plate comprises a substantially circular groove.

4. The chuck of claim 2 wherein said first groove of said chuck plate extends generally spirally outwardly from a first location proximate to said first axis to a second location within said first contact region.

5. The chuck in claim 1, wherein said first plurality of vacuum holes of said chuck plate comprise a first plurality of hole sets, each hole set of said first plurality of hole sets are aligned substantially linearly radially outward, each hole set being equidistant from one another.

6. The chuck in claim 2 wherein said chuck plate includes a second contact region disposed on said first side and around the periphery of said first contact region, said chuck plate having a second groove within said second contact region extending from said first side into said chuck plate, said chuck plate including a second plurality of vacuum holes extending from said second groove into said chuck plate.

7. The chuck in claim 6 wherein said second plurality of vacuum holes extend from said second groove to said first chuck plate vacuum reservoir.

8. The chuck in claim 6 wherein said chuck plate includes a second chuck plate vacuum reservoir extending from said second side into said chuck plate, said second plurality of vacuum holes extending from said second groove of said chuck plate to said second chuck plate vacuum reservoir.

9. The chuck of claim 8 wherein said second groove of said chuck plate comprises a substantially circular groove.

10. The chuck of claim 8 wherein said second groove of said chuck plate extends generally spirally outwardly from a third location to a fourth location within said second contact region.

11. The chuck of claim 1, wherein said second plurality of vacuum holes of said chuck plate comprise a second plurality of hole sets, each hole set of said second plurality of hole sets are aligned substantially linearly radially outward, each hole set being equidistant from one another.

12. The chuck of claim 1 wherein said seal plate includes a third side and a fourth side opposite said third side, said seal plate includes a navel portion integral with said fourth side.

13. The chuck of claim 1 further comprising a manifold plate having a fifth side and a sixth side opposite said fifth side, said fifth side being fixedly attached to said second side of said chuck plate, said manifold plate having a first manifold plate vacuum reservoir extending from said fifth side into said manifold plate, said manifold plate having a second manifold plate vacuum reservoir extending from said sixth side into said manifold plate, said first plurality of vacuum holes of said chuck plate extend through said chuck plate, said seal plate having a third side and a fourth side opposite said third side wherein said third side is fixedly attached to said sixth side of said manifold plate.

14. The chuck of claim 13 wherein said first groove of said chuck plate comprises a substantially circular groove.

15. The chuck of claim 13 wherein said first groove of said chuck plate extends generally spirally outwardly from a first location proximate to said first axis to a second location within said first contact region.

16. The chuck in claim 15 wherein said first plurality of vacuum holes of said chuck plate comprise a first plurality of hole sets, each hole set of said first plurality of hole sets are aligned substantially linearly radially outwardly from said first axis, said first plurality of hole sets are angularly spaced around said first axis substantially equidistant from one another at a first angular distance.

17. The chuck of claim 16 wherein said first manifold plate vacuum reservoir of said manifold plate comprises a first plurality of manifold grooves, each of said manifold grooves of said first plurality of manifold grooves extend substantially linearly radially outwardly from said first axis to a radial distance substantially equal to the radial distance from said first axis to said second location, said first plurality of manifold grooves are angularly spaced around said first axis substantially equidistant from one another at said first angular distance.

18. The chuck of claim 17 wherein said fifth side of said manifold plate is positioned against said second side of said chuck plate so that each manifold groove of said first plurality of manifold grooves linearly radially aligns with a corresponding hole set of said first plurality of hole sets of said chuck plate.

19. The chuck in claim 13 wherein said chuck plate includes a second contact region disposed on said first side and around the periphery of said first contact region, said chuck plate having a second groove within said second contact region extending from said first side into said chuck plate, said chuck plate including a second plurality of vacuum holes extending from said second groove through said chuck plate.

20. The chuck of claim 19 wherein said second groove of said chuck plate extends generally spirally outwardly from a third location to a fourth location within said second contact region.

21. The chuck of claim 20 wherein said second plurality of vacuum holes of said chuck plate are grouped in a second plurality of hole sets, each of said hole sets of said second plurality of hole sets extend substantially linearly radially outwardly from said first axis, said second plurality of hole sets are angularly spaced around said first axis substantially equidistant from one another at a second angular distance.

22. The chuck of claim 21 wherein said sixth side of said manifold plate includes a second plurality of manifold grooves that extend substantially linearly radially outwardly from said first axis to a radial distance substantially equal to the radial distance from said first axis to said fourth location, said second plurality of manifold grooves are angularly spaced around said first axis substantially equidistant from one another at said second angular distance.

23. The chuck of claim 22 wherein each of said manifold grooves of said second plurality of manifold grooves of said manifold plate include a first plurality of manifold holes extending through said manifold plate, said manifold plate is positioned against said chuck plate so that each manifold groove of said second plurality of manifold grooves linearly radially aligns with a corresponding hole set of said second plurality of hole sets of said chuck plate.

\* \* \* \* \*

UNITED STATES PATENT AND TRADEMARK OFFICE
CERTIFICATE OF CORRECTION

PATENT NO. : 6,271,676 B1  Page 1 of 1
DATED : August 7, 2001
INVENTOR(S) : Thomas T. Montoya It is certified that error appears in the above-identified patent and that said Letters Patent is hereby corrected as shown below:

<u>Title page,</u>
Title, delete "SPIRAL CHUCK" and insert -- A SPIRAL CHUCK FOR HOLDING A SEMICONDUCTOR WAFER, UTILIZING SUCTION FORCE TO CREATE ELECTRICAL CONTACT WITH A DEVICE TEST PAD ON THE WAFER --

Signed and Sealed this

Twenty-sixth Day of February, 2002

Attest:

JAMES E. ROGAN
*Attesting Officer*  *Director of the United States Patent and Trademark Office*